US011358684B2

(12) United States Patent
Fonseca

(10) Patent No.: US 11,358,684 B2
(45) Date of Patent: Jun. 14, 2022

(54) AUDIO SYSTEM FOR A VEHICLE AND METHOD OF INSTALLING THE AUDIO SYSTEM

(71) Applicant: Frederico Ferreira Fonseca, Vancouver (CA)

(72) Inventor: Frederico Ferreira Fonseca, Vancouver (CA)

( * ) Notice: Subject to any disclaimer, the term of this patent is extended or adjusted under 35 U.S.C. 154(b) by 0 days.

(21) Appl. No.: 16/909,914

(22) Filed: Jun. 23, 2020

(65) Prior Publication Data

US 2021/0394872 A1    Dec. 23, 2021

(51) Int. Cl.
*H04R 1/02* (2006.01)
*B63B 34/10* (2020.01)
*B63B 83/00* (2020.01)
*H03F 3/183* (2006.01)

(52) U.S. Cl.
CPC .............. *B63B 34/10* (2020.02); *B63B 83/00* (2020.01); *H03F 3/183* (2013.01); *H04R 1/028* (2013.01); *H03F 2200/03* (2013.01); *H04R 2420/07* (2013.01); *H04R 2499/13* (2013.01)

(58) Field of Classification Search
CPC ........... H04R 1/00; H04R 1/02; H04R 1/021; H04R 1/025; H04R 1/026; H04R 1/028; H04R 2201/02; H04R 2420/07; H04R 2499/13; H03F 3/183; H03F 2200/03; B63B 34/10; B63B 83/00
See application file for complete search history.

(56) References Cited

U.S. PATENT DOCUMENTS

| | | | | | |
|---|---|---|---|---|---|
| 4,294,354 | A | * | 10/1981 | Ariga | B65D 5/4229 206/335 |
| 4,445,228 | A | * | 4/1984 | Bruni | H04B 1/082 381/302 |
| 4,768,870 | A | * | 9/1988 | Chen | H04R 1/021 381/389 |
| D519,887 | S | * | 5/2006 | Files | D12/114 |
| D552,516 | S | * | 10/2007 | Files | D12/114 |
| 7,742,615 | B1 | * | 6/2010 | Lopez | B62J 17/04 381/389 |
| 2003/0091201 | A1 | * | 5/2003 | Dykstra | B60R 1/008 381/86 |
| 2003/0142422 | A1 | * | 7/2003 | Spitzer | B62J 99/00 359/842 |

(Continued)

*Primary Examiner* — Thang V Tran
(74) *Attorney, Agent, or Firm* — Nexus Law Group LLP; Nicholas P. Toth

(57) ABSTRACT

An audio system for a vehicle, such as a personal watercraft, having a vehicle body dimensioned for receiving a side-view mirror, includes a speaker pod that includes a housing dimensioned for supporting a speaker operable to produce sound, and a mounting member for mounting the speaker pod to the vehicle body in place of the side-view mirror. A portion of the housing is shaped similarly to a corresponding portion of the side-view mirror. A method of installing an audio system on a vehicle having a vehicle body dimensioned for receiving a side-view mirror involves: (a) determining that the side-view mirror is removed from the vehicle body; and (b) mounting a speaker pod of the audio system, along a mounting member of the speaker pod, to the vehicle body in place of the side-view mirror such that a housing of the speaker pod supports a speaker operable to produce sound.

8 Claims, 7 Drawing Sheets

(56) References Cited

U.S. PATENT DOCUMENTS

| | | | | |
|---|---|---|---|---|
| 2008/0273715 A1* | 11/2008 | Snider | ............. | B60R 11/0217 |
| | | | | 381/86 |
| 2011/0274287 A1* | 11/2011 | Zielinski | ............. | H04B 1/082 |
| | | | | 381/86 |
| 2014/0177865 A1* | 6/2014 | Kamio | ............. | H03G 3/32 |
| | | | | 381/86 |
| 2016/0031415 A1* | 2/2016 | Kunisada | ............. | B62M 25/00 |
| | | | | 180/219 |

* cited by examiner

AUDIO SYSTEM FOR A VEHICLE AND METHOD OF INSTALLING THE AUDIO SYSTEM

BACKGROUND OF THE INVENTION

1. Field of Invention

This invention generally relates to audio systems and, in particular, to an audio system for a vehicle, which may be a personal watercraft, and a method of installing the audio system on the vehicle.

2. Description of Related Art

Audio systems for playing recorded music and/or radio broadcasts through audio system speakers are known. Vehicles sold or retrofitted with audio systems are known. For automobiles, audio system speakers are often integrated into door panels for unobtrusive listening. However, restricting the location of the speakers to the door panels does not provide a full range of useable locations for speakers.

Vehicles are known to include rear-view mirrors, including side-view mirrors for viewing in the rearward direction along the side of the vehicle. Often, a pair of side-view mirrors is employed with one side-view mirror being present on each lateral side of the vehicle.

Some vehicles are personal watercraft, and some personal watercraft have side-view mirrors. However, personal watercraft typically do not have doors or door panels and thus cannot support audio speakers therein.

An object of the invention is to address the above shortcomings.

SUMMARY

The above shortcomings may be addressed by providing, in accordance with one aspect of the invention, an audio system for a vehicle having a vehicle body dimensioned for receiving a side-view mirror. In accordance with another aspect of the invention, there is provided a personal watercraft having installed thereon the audio system.

The audio system includes a speaker pod that includes a housing dimensioned for supporting a speaker operable to produce sound, the speaker pod further including a mounting member dimensioned for mounting the speaker pod to the vehicle body in place of the side-view mirror.

At least a portion of the housing may be shaped similarly to a corresponding portion of the side-view mirror. The portion may be an outer forward portion of the housing. The speaker pod may include a pod bracket for attaching the portion to the vehicle, the pod bracket comprising the mounting member. The audio system may further include an audio amplifier for driving the speaker. The audio system may further include an amplifier bracket for mounting the amplifier to the vehicle body such that the speaker is in electrical communication with the amplifier. The vehicle may include a battery. The audio system may further include a battery-disconnect switch in electrical communication with the battery and the amplifier. The audio system may further include a user-input controller. The user-input controller may be operable to receive user input via wireless communications. The user-input controller may be operable to receive user input via wireless communications when the controller is in electrical communication with the amplifier. The vehicle may be a personal watercraft. The speaker may be marine grade. The vehicle body may be dimensioned for receiving a second one of the side-view mirror. The audio system may further include a second one of the speaker pod. The second speaker pod may include a second one of the housing. The housing may be dimensioned for supporting a second one of the speaker. The second speaker pod may be dimensioned for mounting to the vehicle body in place of the second side-view mirror. The audio amplifier may be operable to drive the speaker and the second speaker. The amplifier bracket may be operable to mount the amplifier to the vehicle body such that each of the speaker and the second speaker is in electrical communication with the amplifier. The second speaker may be marine grade. The amplifier may be marine grade.

In accordance with another aspect of the invention, there is provided a method of installing an audio system on a vehicle having a vehicle body dimensioned for receiving a side-view mirror. The method involves: (a) determining that the side-view mirror is removed from the vehicle body; and (b) mounting a speaker pod of the audio system, along a mounting member of the speaker pod, to the vehicle body in place of the side-view mirror such that a housing of the speaker pod supports a speaker operable to produce sound.

Step (b) may involve mounting the speaker pod such that at least a portion of the housing is shaped similarly to a corresponding portion of the side-view mirror. Step (b) may involve attaching the at least portion to the vehicle via a pod bracket of the speaker pod when the pod bracket includes the mounting member. Step (b) may involve mounting the speaker pod such that an outer forward portion of the housing is shaped similarly to a corresponding portion of the side-view mirror. Step (b) may involve attaching the outer forward portion to the vehicle via a pod bracket of the speaker pod when the pod bracket includes the mounting member. The method may further involve: (c) mounting an audio amplifier via an amplifier bracket to the vehicle body such that the amplifier is operable to drive the speaker when the speaker is in electrical communication with the amplifier. The method may further involve: (d) installing a battery-disconnect switch in electrical communication with the amplifier and a battery of the vehicle. The method may further involve: (e) installing a user-input controller in electrical communication with the amplifier such that the controller is operable to receive user input via wireless communications. Step (b) may involve mounting the speaker pod when the vehicle is a personal watercraft and the speaker is marine grade. Step (c) may involve mounting the amplifier when the vehicle is a personal watercraft and the amplifier is marine grade. The method may further involve: (f) mounting a second one of the speaker pod, along a second mounting member of the second speaker pod, to the vehicle body in place of a second side-view mirror of the vehicle such that a second one of the housing of the second speaker pod supports a second one of the speaker. Step (f) may involve mounting the speaker pod when the vehicle is a personal watercraft and the second speaker is marine grade.

In accordance with another aspect of the invention, there is provided an audio system installation kit for a vehicle having a vehicle body dimensioned for receiving a side-view mirror. The kit includes: (a) a speaker pod that includes a housing dimensioned for supporting a speaker operable to produce sound, the speaker pod further including a mounting member; and (b) instructions for mounting the speaker pod along the mounting member to the vehicle body in place of the side-view mirror.

The kit may further include an audio amplifier. The kit may further include an amplifier bracket. The kit may include instructions for mounting the amplifier to the vehicle body such that the speaker is in electrical communication with the amplifier. The kit may include instructions for mounting the audio amplifier via the amplifier bracket to the vehicle body such that the amplifier is operable to drive the speaker when the speaker is in electrical communication with the amplifier. The kit may further include a battery-disconnect switch. The kit may include instructions for installing the battery-disconnect switch in electrical communication with the amplifier and a battery of the vehicle. The kit may further include a user-input controller. The kit may include instructions for installing the user-input controller in electrical communication with the amplifier such that the controller is operable to receive user input via wireless communications. The kit may further include a second one of the speaker pod. The kit may include instructions for mounting the second speaker pod, along a second mounting member of the second speaker pod, to the vehicle body in place of a second side-view mirror of the vehicle such that a second one of the housing of the second speaker pod supports a second one of the speaker.

In accordance with another aspect of the invention, there is provided an audio system for a vehicle having a vehicle body dimensioned for receiving a side-view mirror. The audio system includes: (a) first means for producing sound; and (b) second means for mounting the first means to the vehicle body in place of the side-view mirror. The audio system may further include: (c) third means for mounting to the vehicle body an audio amplifier for driving the first means.

The foregoing summary is illustrative only and is not intended to be in any way limiting. Other aspects and features of the present invention will become apparent to those of ordinary skill in the art upon review of the following description of embodiments of the invention in conjunction with the accompanying figures and claims.

BRIEF DESCRIPTION OF THE DRAWINGS

In drawings which illustrate by way of example only embodiments of the invention.

DETAILED DESCRIPTION

An audio system for a vehicle, the vehicle having a vehicle body dimensioned for receiving a side-view mirror, includes: first means for producing sound; and second means for mounting the first means to the vehicle body in place of the side-view mirror. The audio system may further include: third means for mounting to the vehicle body an audio amplifier for driving the first means.

Figure 1:
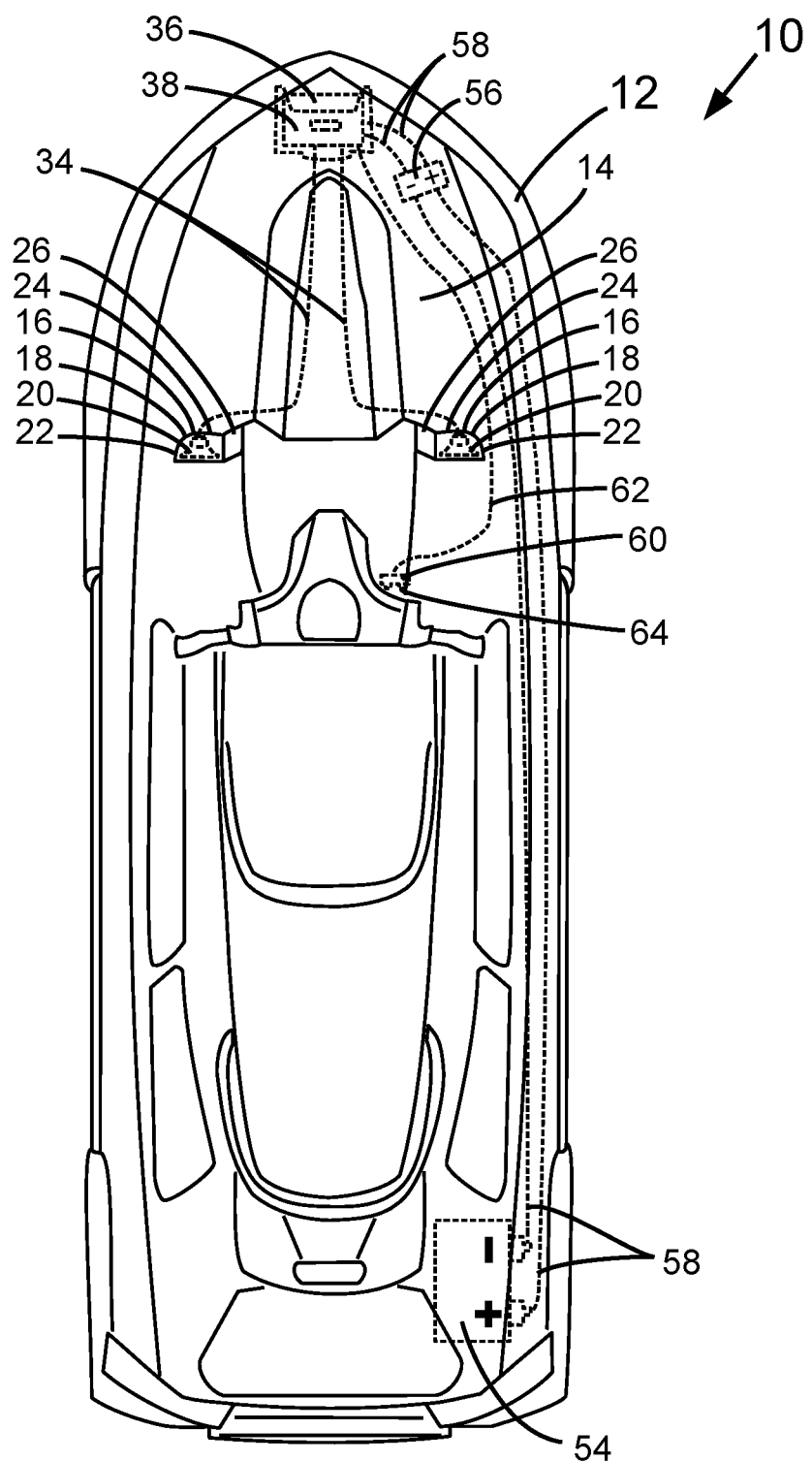
FIG. 1 is a top view of an audio system installed on a personal watercraft according to embodiments of the invention, showing a pair of speaker pods installed in place of side-view mirrors.

Referring to FIG. 1, the audio system according to a first embodiment of the invention is shown generally at 10. The audio system 10 is operable to be installed on a vehicle such as the personal watercraft 12 shown in FIG. 1. The personal watercraft 12 may be a WaveRunner™, Jet Ski™, Sea-Doo™, or other brand of personal watercraft, for example. In variations, the audio system 10 is operable to be installed on other types of vehicles, with corresponding changes being made depending on the vehicle type. In all embodiments described herein, it is assumed that the vehicle has a vehicle body capable of receiving at least one side-view mirror (not shown).

The audio system 10 is operable to play recorded music and/or radio broadcasts through a speaker pod 16 that has been installed in the place where the personal watercraft 12 ordinarily would have a side-view mirror. In the embodiment of FIG. 1, the personal watercraft 12 has a vehicle body 14 dimensioned for receiving a pair of side-view mirrors (not shown), and a pair of speaker pods 16 has been installed in place of the pair of side-view mirrors.

In some embodiments, only a single speaker pod 16 is employed. For some vehicles, using only a single speaker pod 16 allows one side-view mirror of the vehicle to remain in its usual place. In other embodiments, however, a pair of speaker pods 16 is used, in place of the corresponding pair of side-view mirrors, to provide stereo sound for example.

Figure 2:
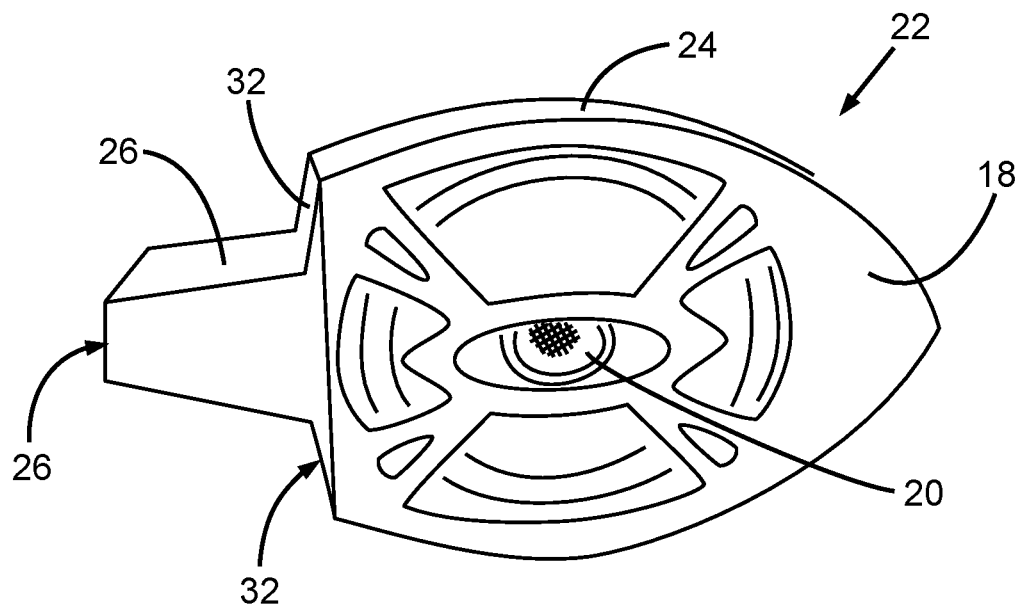
FIG. 2 is a perspective view of one speaker pod shown in FIG. 1, showing a speaker housed within the speaker pod and showing a pod bracket.

Referring to FIGS. 1 and 2, each speaker pod 16 in the first embodiment includes a housing 18 dimensioned to support a speaker 20 that is operable to produce sound. In general, the speaker 20 may be any suitable audio speaker, such as a commercially available speaker or a customized speaker for example, that is dimensioned to fit within the housing 18. In general, any suitable number of suitably dimensioned speakers 20 may be employed within each housing 18, and one or more speakers 20 each having multiple speaker sections operable to produce sound may be employed.

In the first embodiment, at least a portion 22 of each housing 18 is shaped similarly to a corresponding portion of the side-view mirror. For example, a forward-facing portion 22 of the housing 18 may be contoured to minimize wind resistance. In some embodiments, the housing 18 is shaped such that the general appearance of the housing 18 is merely reminiscent of a side-view mirror. In some embodiments, the portion 22 of the housing 18 that is shaped like a corresponding portion of a side-view mirror is an outer forward portion 24 of the housing 18. In the exemplary embodiment of FIG. 1, the outer forward portion 24 is convex in the direction facing the front of the personal watercraft 12. In the first embodiment, each outer forward portion 24 is rounded in directions facing the front to closest side of the personal watercraft 12.

Figure 3:
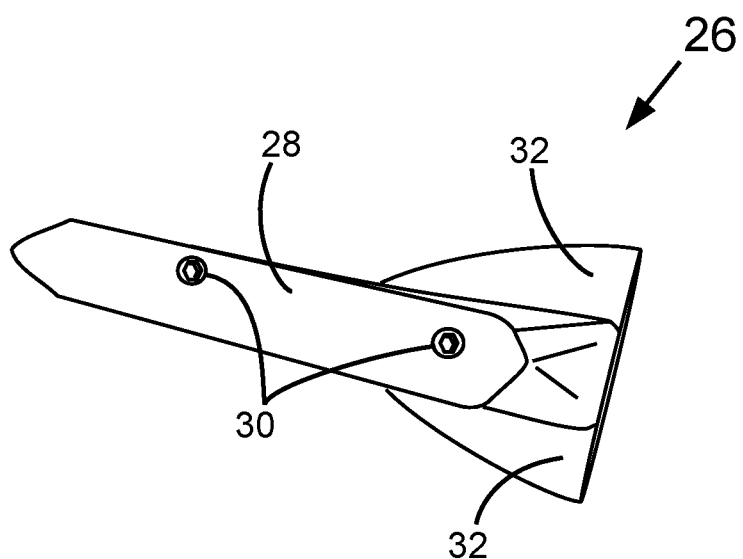
FIG. 3 is a perspective view of the pod bracket shown in FIG. 2, showing a mounting wall of the pod bracket.

A pod bracket, such as the bracket 26 shown in FIGS. 1 to 3, is dimensioned for attaching the portion 22 to the personal watercraft 12. The bracket 26 includes a mounting member, such as at least one mounting wall 28 best seen in FIG. 3, dimensioned for attachment to the personal watercraft 12.

In the first embodiment, the mounting wall 28 provides a surface for contacting the body 14 of the personal watercraft 12. Such surface is typically flat, but in general can be contoured in any manner suitable for attaching the speaker pod 16 to the body 14. In the first embodiment a number of threaded collars 30 are present at the mounting wall 28 for receiving a fastener (not shown) passing through the body 14 of the personal watercraft 12. In general, any suitable size and shape may be employed for the mounting wall 28 and any suitable size and type of threaded collar 30 or other suitable fastening mechanism may be employed. The dimensions of the mounting wall 28, the dimensions and number of the threaded collars 30, the type of fastening mechanism employed, the number of mounting walls 28 for each bracket 26, the dimensions and number of brackets 26 for each speaker pod 16, and other similar mechanical properties, may be varied according to different models of personal watercrafts 12 for example. In some embodiments, multiple mounting walls 28 facing in different directions are employed.

In the first embodiment of FIGS. 2 and 3, the bracket 26 includes an attachment flange 32 for attaching the bracket 26 to the portion 22. In general, the bracket 26 may be attached to the portion 22 in any suitable manner, including by use of fasteners similar to those employed to attach the bracket 26 to the body 14 of the personal watercraft 12, by use of other fastening mechanisms, by use of adhesive, by thermoplastic welding or other welding, or other suitable attachment techniques. In some embodiments, the bracket 26 and the portion 22 are integrally attached to each other as a single piece.

Referring back to FIG. 1, the audio system 10 includes speaker wires 34 extending between each speaker pod 16 and an audio amplifier 36 to place each speaker pod 16 in electrical communication with the amplifier 36, which is operable to electrically drive the speaker(s) 20 of each speaker pod 16 to produce sound. Elements of FIG. 1, such as the speaker wires 34, that are ordinarily covered by the typically non-transparent body 14 of the personal watercraft 12, when viewed from the top, are shown by dotted line.

Figure 4:
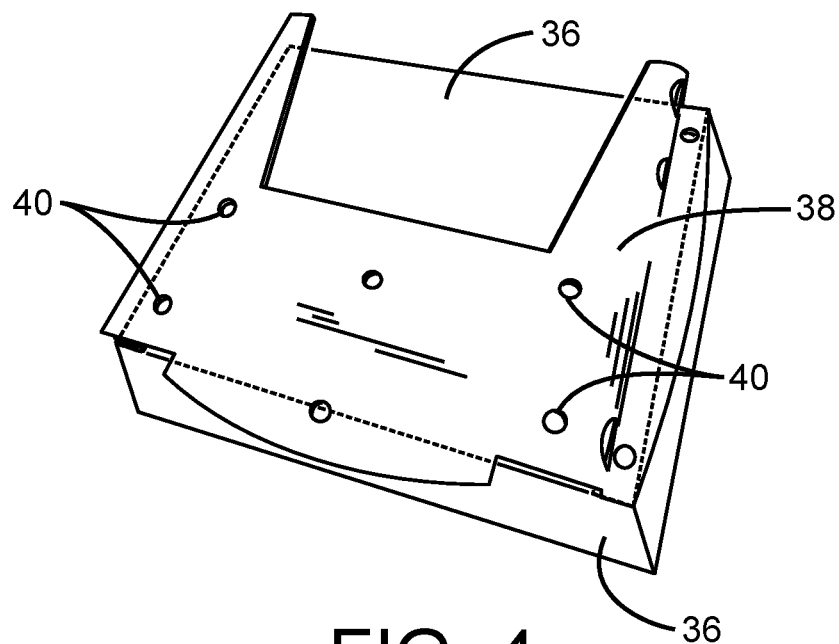
FIG. 4 is a perspective view of an amplifier and amplifier bracket shown in FIG. 1, showing the top side of the amplifier bracket above the amplifier.
Figure 5:
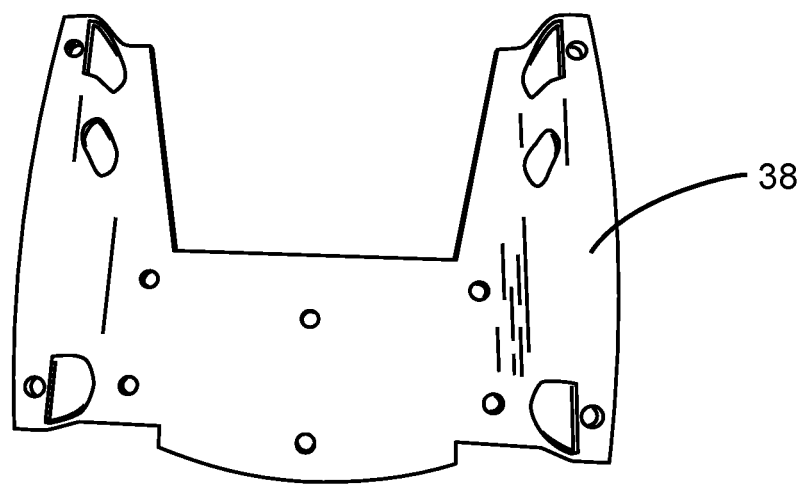
FIG. 5 is a perspective view of the amplifier bracket showin in FIG. 4, showing the bottom side of the amplifier bracket.

Referring to FIGS. 1 and 4 to 6, the amplifier 36 is mounted to the body 14 of the personal watercraft 12 via an amplifier bracket 38 and fasteners 39. In FIG. 4, the portion of the amplifier 36 covered by the non-transparent amplifier bracket 38 is shown by dotted line. The top side of the amplifier bracket 38 is shown in FIG. 4, and the bottom side of the amplifier bracket 38 is shown in FIG. 5.

As seen in FIGS. 4 and 5, the amplifier bracket 38 includes mounting apertures 40.

Figure 6:
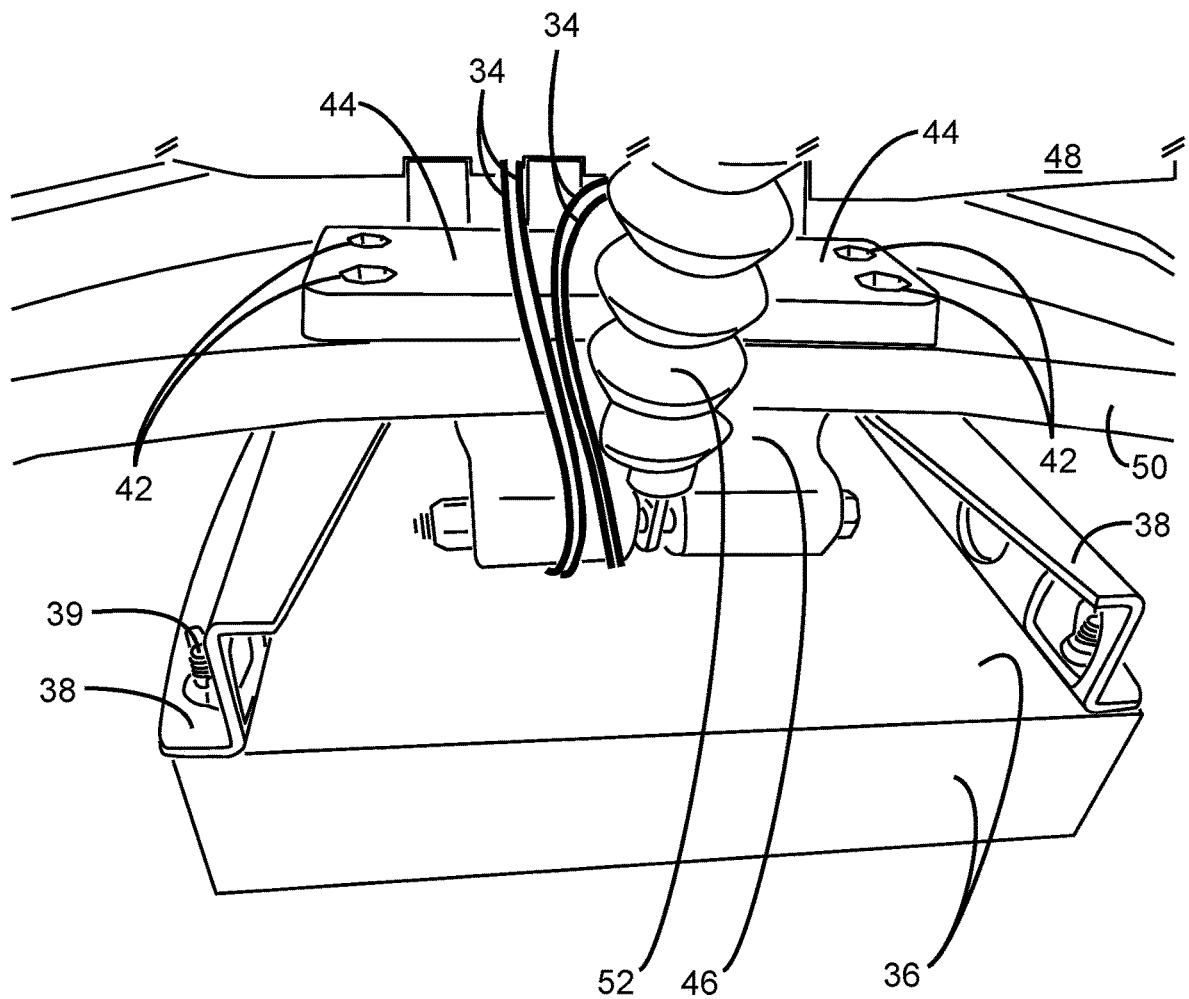
FIG. 6 is a perspective view of the amplifier and amplifier bracket shown in FIG. 4, showing the amplifier and amplifier bracket installed on the personal watercraft beneath its front hood.

As seen in FIG. 6, the mounting apertures 40 are dimensioned for receiving mounting bolts (not shown) that also pass through apertures 42 of an upper plate 44 and corresponding apertures (not visible in FIG. 6) of a lower plate 46. The upper and lower plates 44 and 46 are disposed near the front of the personal watercraft 12 and typically form part of the personal watercraft 12 for the purpose of hingedly connecting a front hood 48 of the personal watercraft 12 to a chassis 50 and/or body 14 of the personal watercraft 12. In the first embodiment, the hood 48 can be raised, thereby extending the hood strut 52. FIG. 6 shows the hood 48 in its raised position.

As seen in FIG. 6, the speaker wires 34 are routed for electrical communication between the speakers 20 and the amplifier 36. Typically, there are two speaker wires 34 for each speaker 20.

Referring back to FIG. 1, the personal watercraft 12 typically includes a battery 54, and the audio system 10 in the first embodiment includes a battery-disconnect switch 56 in electrical communication with the battery 54 and the amplifier 36 via power wires 58. The battery-disconnect switch 56 is operable to automatically disconnect the amplifier 36 from the battery 54 if its voltage becomes reduced to a low-voltage threshold, thereby advantageously preventing the use of the amplifier 36 from completely discharging the battery 54.

The audio system 10 includes a user-input controller, such as the controller 60 shown in FIG. 1, in electrical communication with the amplifier 36 via the controller wires 62 that are routed within the body 14 of the personal watercraft 12. The controller 60 receives user-input from an operator (not shown) of the personal watercraft 12 for controlling operations of the amplifier 36. User-input functions of the controller 60 may include on/off, audio volume, play/pause, stop, fast forward, reverse, other audio-related functions, and any combination thereof for example.

In the first embodiment as shown in FIG. 1, the controller 60 includes one or more buttons 64 for manually receiving user input.

In some embodiments, the controller 60 is operable to receive user input via wireless communications, such as receiving user-input from a smartphone (not shown) or similar computing device operable to send and receive communications, which in variations may be any general purpose computer device, laptop computer, tablet computer, personal communication device, wearable technology device, similar computational device, or any combination thereof for example. Wireless communications may be implemented using any suitable telephone or other communications technology, for example. In general, communications between the controller 60 and the amplifier 36 may be transmitted via any radio link, cellular telephone link, satellite link, line-of-sight free-optics link, and any combination thereof for example. The user input may be received via a communications network such as the Internet (not shown). Additionally or alternatively, the user input may be received via near-field wireless communications (e.g. Bluetooth™ standard communications, NFC (Near-Field Communications) standard communications, etc.), for example.

In the first embodiment, the controller 60 is operable to receive user-input via its buttons 64 and via wireless communications, at the user's preference. Wireless communications in the first embodiment employs Bluetooth™ standard communications.

In the first embodiment, the vehicle shown in the Figures is a personal watercraft 12 and the various components of the audio system 10, such as the speaker(s) 20 and the amplifier 36, are marine grade. In general, however, the present invention is suitable for use with any type of vehicle having a vehicle body dimensioned for receiving a mirror. Accordingly, the speaker(s) 20 and the amplifier 36 are not marine grade in all embodiments of the invention.

Thus, there is provided an audio system for a vehicle having a vehicle body dimensioned for receiving a side-view mirror, the audio system comprising a speaker pod comprising a housing dimensioned for supporting a speaker operable to produce sound, the speaker pod further comprising a mounting member dimensioned for mounting the speaker pod to the vehicle body in place of the side-view mirror.

Installation Method

Figure 7:
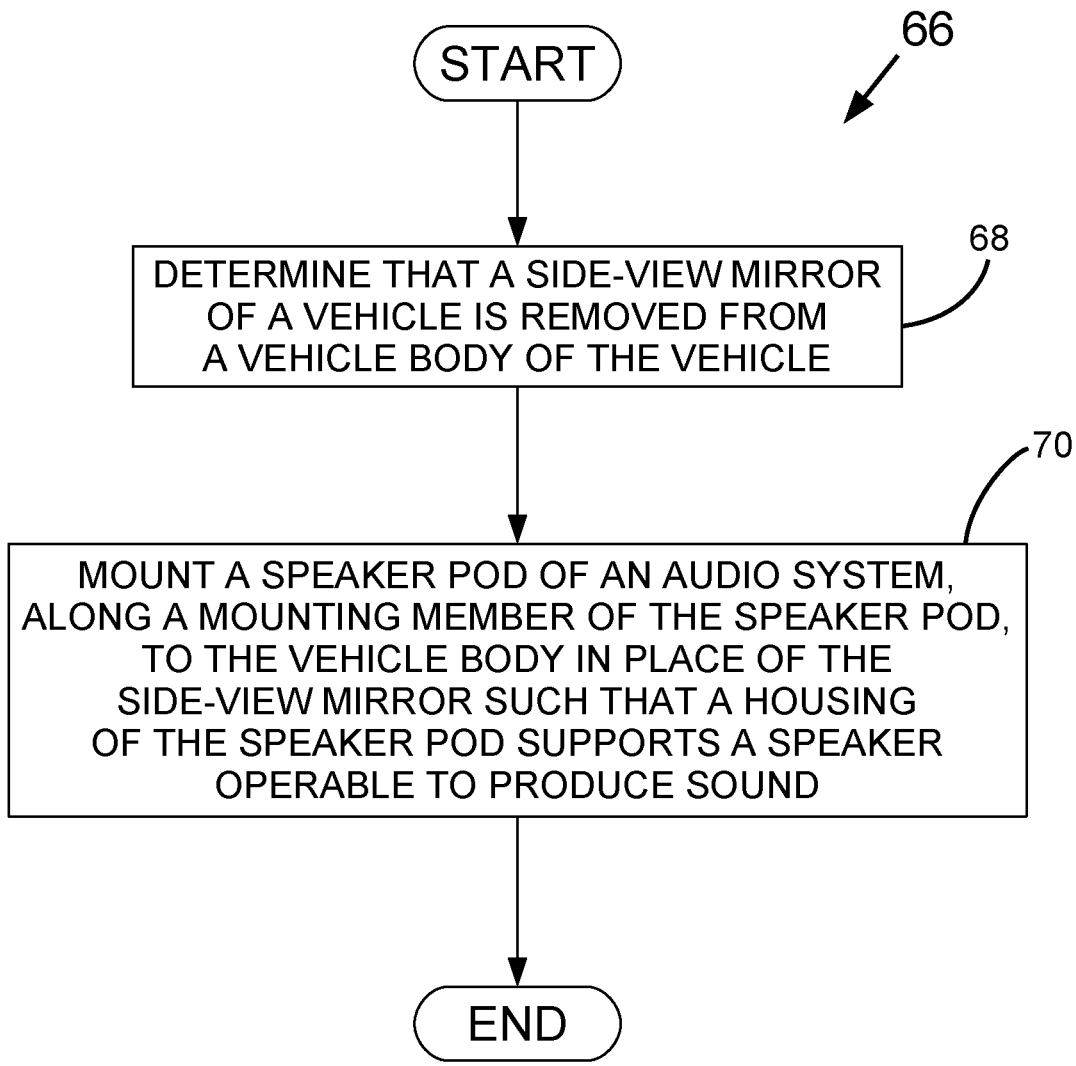
FIG. 7 is a flow diagram of a method of installing the audio system of FIG. 1 according to embodiments of the invention.

Referring to FIG. 7, an exemplary method, according to the embodiments of the invention, for installing the audio system 10 on a vehicle, such as the personal watercraft 12, is shown generally at 66.

Method 66 begins at step 68, which directs an installer (not shown) to determine that a side-view mirror of the vehicle is removed from a vehicle body of the vehicle. Typically, the side-view mirror is original equipment of the vehicle and determining that the side-view mirror is removed from the vehicle involves removing the side-view mirror. In any event, once the side-view mirror is confirmed as having been removed from the vehicle, the method 66 proceeds to step 70.

Step 70 directs the installer to mount a speaker pod of an audio system, along a mounting member of the speaker pod, to the vehicle body in place of the side-view mirror such that a housing of the speaker pod supports a speaker operable to produce sound.

In the exemplary case of the personal watercraft 12 and with reference to FIG. 1, step 70 of FIG. 7 involves mounting the speaker pod 16 of the audio system 10, along the mounting wall 28, to the body 14 in place of the side-view mirror such that the housing 18 supports the speaker 20 that is operable to produce sound. After step 70 has been completed, the method 66 ends.

In some embodiments, further steps in addition to steps 68 and 70 are performed by the method 66. An exemplary method for performing additional steps of method 66 is shown in FIG. 8 generally at 72.

Figure 8:
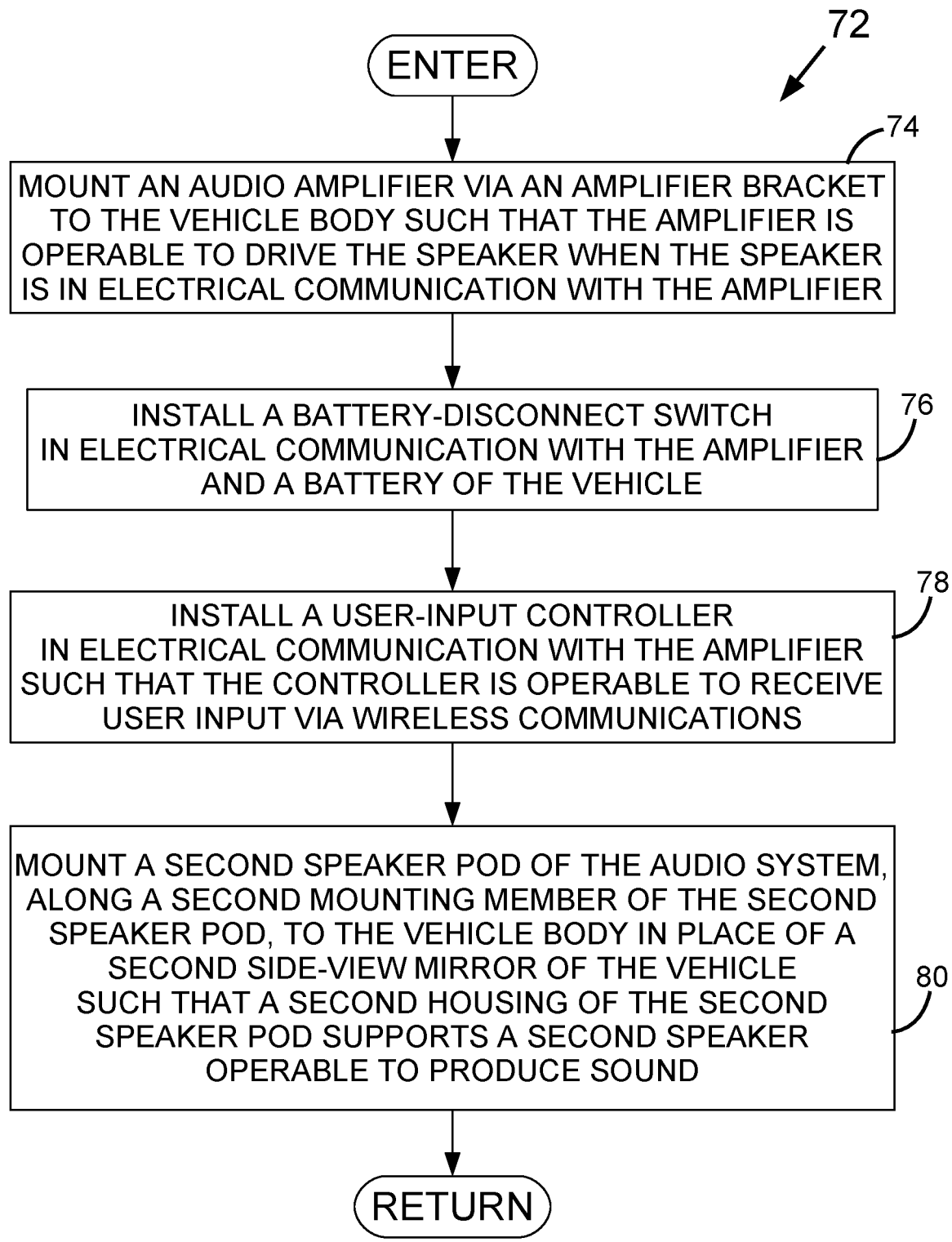
FIG. 8 is a flow diagram of a method for performing additional steps of the method of FIG. 7 according to additional embodiments of the invention, showing the step of mounting a second speaker pod.

Referring to FIG. 8, method 72 begins at step 74, which directs the installer to mount an audio amplifier via an amplifier bracket to the vehicle body such that the amplifier is operable to drive the speaker when the speaker is in electrical communication with the amplifier.

In the exemplary case of the personal watercraft 12 and with reference to FIG. 1, step 74 of FIG. 8 involves mounting the amplifier 36 via the amplifier bracket 38 to the body 14 such that the amplifier 36 is operable to drive the speaker 20 when the speaker 20 is in electrical communication with the amplifier 36. After step 74 has been completed, the method 72 proceeds to step 76.

Step 76 directs the installer to install a battery-disconnect switch in electrical communication with the amplifier and a battery of the vehicle.

In the exemplary case of the personal watercraft 12 and with reference to FIG. 1, step 76 of FIG. 8 involves installing the battery-disconnect switch 56 in electrical communication with the amplifier 36 and the battery 54. After step 76 has been completed, the method 72 proceeds to step 78.

Step 78 directs the installer to install a user-input controller in electrical communication with the amplifier such that the controller is operable to receive user input via wireless communications.

In the exemplary case of the personal watercraft 12 and with reference to FIG. 1, step 78 of FIG. 8 involves installing the controller 60 in electrical communication with the amplifier 36 such that the controller 60 is operable to receive user input via wireless communications. After step 78 has been completed, the method 72 proceeds to step 80.

Step 80 directs the installer to mount a second speaker pod of the audio system, along a second mounting member of the second speaker pod, to the vehicle body in place of a second side-view mirror of the vehicle such that a second housing of the second speaker pod supports a second speaker operable to produce sound.

In the exemplary case of the personal watercraft 12 and with reference to FIG. 1, step 80 of FIG. 8 involves mounting a second speaker pod 16, along a second mounting wall 28, to the body 14 in place of the second side-view mirror of the personal watercraft 12 such that a second housing 18 of the second speaker pod 16 supports a second speaker 20 that is operable to produce sound.

It should be noted that in general steps 70 (FIGS. 7) and 74 to 80 (FIG. 8) can be performed in any order and that, in some embodiments, one or more of steps 74 to 80 (FIG. 8) can be omitted.

After step 80 has been completed, the method 72 returns to the method 66 at step 70 (FIG. 7). After step 70 has been completed, the method 66 ends.

Figure 9:
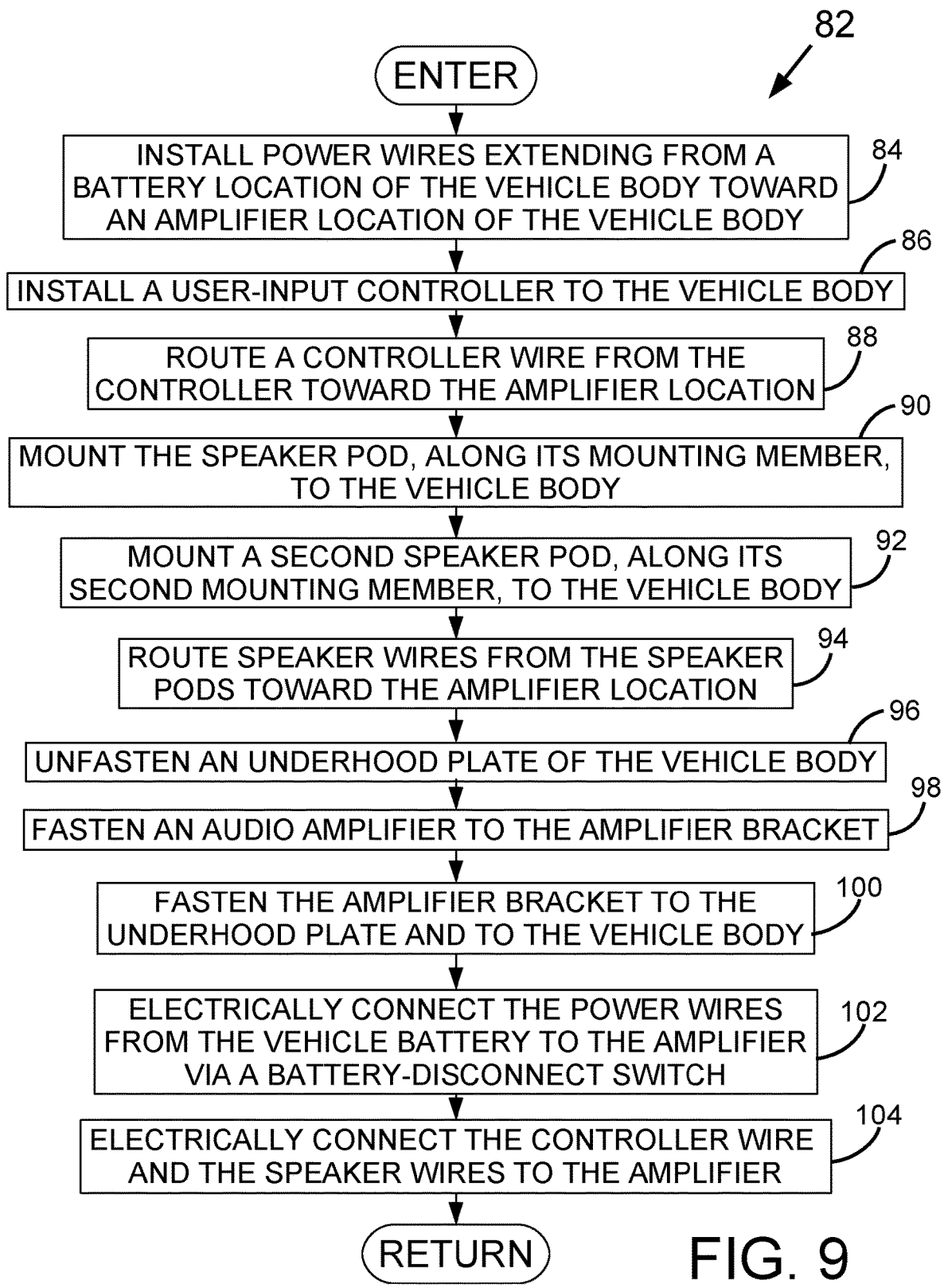
FIG. 9 is a flow diagram of a detailed method for performing certain steps of FIGS. 7 and 8, showing the steps of electrically connecting power wires, a controller wire, and speaker wires.

Referring to FIG. 9, a detailed exemplary method for performing step 70 of method 66 (FIG. 7) and the additional steps of method 82 (FIG. 8) is shown generally at 82.

Method 82 begins at step 84, which directs the installer to install power wires extending from a battery location of the vehicle body toward an amplifier location of the vehicle body.

In the exemplary case of the personal watercraft 12 and with reference to FIG. 1, step 84 of FIG. 9 involves installing the power wires 58 so that they extend from the location of the battery 54 toward an amplifier 36 location of the body 14. The amplifier 36 location in the first embodiment is at the front of the personal watercraft 12 underneath the front hood 48.

Installing the power wires 58 typically involves: (a) removing a seat (not shown) of the personal watercraft 12 to permit access to the battery 54; (b) disconnecting the battery 54 for safe installation of the audio system 10; and (c) connecting one (typically red) power wire 58 to the positive terminal of the battery 54 and one (typically black) power wire 58 to the negative terminal of the battery 54. Thereafter, the power wires 58 are routed under the exterior of the body 14 toward the front of the personal watercraft 12 for later use during installation.

After step 84 has been completed, the method 82 proceeds to step 86, which directs the installer to install a user-input controller to the vehicle body. In the exemplary case of the personal watercraft 12 and with reference to FIG. 1, step 86 of FIG. 9 involves installing the controller 60 to the body 14.

In the first embodiment, installing the controller 60 involves cutting a hole (not shown) in an operator-accessible area of a panel of the body 14, such as in the right- or left-side fairing of the body 14. In some personal watercrafts 12, a convenient location is adjacent a storage compartment (not shown), for example. In general, any location that is accessible to the operator is suitable. The hole has a diameter of approximately 3 cm (1⅛"), such as by being in a range of 2-4 cm (¾" to 1½"), for example. In the first embodiment, the hole is sized to accommodate the controller 60, and installing the controller 60 involves receiving the controller 60 in the hole so that its buttons 64 are accessible to the operator during ordinary use and the controller wires 62 are behind the panel of the body 14.

After step 86 has been completed, the method 82 proceeds to step 88, which directs the installer to route a controller wire from the controller toward the amplifier location. In the exemplary case of the personal watercraft 12 and with reference to FIG. 1, step 88 of FIG. 9 involves routing the controller wires 62 behind the panel along the interior defined by the body 14 of the personal watercraft 12 to the amplifier 36 location.

After step 88 has been completed, the method 82 proceeds to step 90, which directs the installer to mount the speaker pod, along its mounting member, to the vehicle body. In the exemplary case of the personal watercraft 12 and with reference to FIGS. 1 to 3, step 90 of FIG. 9 involves mounting the speaker pod 16, along the mounting wall 28, to the body 14.

In the first embodiment, mounting the speaker pod 16 involves placing the mounting wall(s) 28 against the body 14 in the original place that the side-view mirror previously occupied, and inserting the fasteners (not shown) previously used for the side-view mirror through side-view mirror apertures (not shown) of the body 14 to engage each threaded collar 30 so as to fasten the speaker pod 16 to the body 14 at each threaded collar 30.

After step 90 has been completed, the method 82 proceeds to step 92, which directs the installer to mount a second speaker pod, along its second mounting member, to the vehicle body. In the exemplary case of the personal watercraft 12 and with reference to FIGS. 1 to 3, step 92 of FIG. 9 involves mounting the second speaker pod 16, along its second mounting wall 28, to the body 14. Mounting the second speaker pod 16 follows the same general principles as mounting the first speaker pod 16, but typically on the opposite side of the personal watercraft 12. In embodiments in which only one speaker pod 16 is installed, step 92 is omitted.

After step 92 has been completed, the method 82 proceeds to step 94, which directs the installer to route speaker wires from the speaker pods toward the amplifier location. In the exemplary case of the personal watercraft 12 and with reference to FIG. 1, step 94 of FIG. 9 involves routing speaker wires 34 from each of the first and second speaker pods 16 to the amplifier 36 location.

In the first embodiment, routing the speaker wires 34 involves drilling a small hole through the body 14 adjacent each speaker pod 16; passing the speaker wires 34 of a given speaker pod 16 through its adjacent hole into the interior defined by the body 14; and routing the speaker wires 34 within the body 14 and under the hood 48 to the amplifier 36 location. The small hole has a diameter of approximately 3 mm (⅛"), such as by being in a range of 2-4 mm (¹⁄₁₆" to ⁵⁄₃₂"), for example.

After step 94 has been completed, the method 82 proceeds to step 96, which directs the installer to unfasten an underhood plate of the vehicle body. In the exemplary case of the personal watercraft 12 and with reference to FIG. 6, step 96 of FIG. 9 involves unfastening the lower plate 46 from the body 14.

In the first embodiment, four nuts (not shown) associated with the apertures 42 are removed to release the lower plate 46 from the chassis 50 and the upper plate 44. The lower plate is then typically removed from from the chassis 50 for ease of manipulation, while four associated bolts (not visible in FIG. 6) can remain with the upper plate 44 at the apertures 42.

After step 96 has been completed, the method 82 proceeds to step 98, which directs the installer to fasten an audio amplifier to the amplifier bracket. In the exemplary case of the personal watercraft 12 and with reference to FIGS. 1, 4 and 6, step 98 of FIG. 9 involves fastening the amplifier 36 to the amplifier bracket 38, such as by fasteners 39 (FIG. 6).

After step 98 has been completed, the method 82 proceeds to step 100, which directs the installer to fasten the amplifier bracket to the underhood plate and to the vehicle body. In the exemplary case of the personal watercraft 12 and with reference to FIG. 6, step 100 of FIG. 9 involves fastening the amplifier bracket 38 to the lower plate 46 and to the body 14.

In the first embodiment, the the amplifier bracket 38 is placed against the lower plate 44 and the upper and lower plates 44 and 46 are fastened to each other on opposing sides of the chassis 50 using the four nuts previously removed during step 96. This is done when the amplifier 36 is already fastened to the amplifier bracket 38 according to step 98, thereby mounting the amplifier 36 to the chassis 50 of the personal watercraft 12 underneath the hood 48. When the hood 48 is lowered into its closed position, the amplifier 36 is advantageously not visible from the outside of the personal watercraft 12.

After step 100 has been completed, the method 82 proceeds to step 102, which directs the installer to electrically connect the power wires from the vehicle battery to the amplifier via a battery-disconnect switch. In the exemplary case of the personal watercraft 12 and with reference to FIG. 1, step 102 of FIG. 9 involves electrically connecting the power wires 58 from the battery 54 to the amplifier 36 via the battery-disconnect switch 56.

In the first embodiment, the battery-disconnect switch 56 is disposed adjacent to the amplifier 36 and remains in place due to the minimal length of the power wires 58 used between the battery-disconnect switch 56 and the amplifier 36. In some embodiments, the battery-disconnect switch 56 is affixed to one or more of the amplifer 36, amplifier bracket 38, lower plate 44, upper plate 46, hood 48, chassis 50, or other structural or non-structural component(s) of the personal watercraft 12, for example. The battery-disconnect switch 56 can be affixed in any suitable manner, such as taped, glued, adhered, bolted, strapped, etc., for example. In some embodiments, the battery-disconnect switch 56 is not used and the power wires 58 are directly connected between the battery 54 and the amplifier 36. In some embodiments, other power conditioning component(s) and/or circuitry (not shown), such as filter(s), voltage converter(s), voltage regulator(s), and the like, is optionally employed.

After step 102 has been completed, the method 82 proceeds to step 104, which directs the installer to electrically connect the controller wire and the speaker wires to the amplifier. In the exemplary case of the personal watercraft 12 and with reference to FIG. 1, step 104 of FIG. 9 involves electrically connecting the controller wires 62 and the speaker wires 34 to the amplifier 36.

In the first embodiment, standard connectors (not shown) are employed to connect the ends of the wires 62 and 34, which are already at the amplifier 36 location, to the amplifier 36 at suitable connection points (not shown) of the amplifier 36. At the conclusion of step 104 in the first embodiment, the battery 54 can be safely re-connected and the seat replaced after having been disconnected and removed, respectively, during step 84.

It should be noted that in different embodiments the steps 84 to 104 can be performed in a variety of different orders. For example, steps 90 and 92 can be performed in any order; steps 102 and 104 can be performed in any order; step 84 can be performed at any time in any order prior to step 102; steps 88 and 94 can be performed at any time in any order prior to step 104; and other variations are possible. It should also be noted that some steps are omitted in some embodiments. For example, steps 76, 78 and 80 of method 72, steps 86 and 88 of method 82, and steps 94 and 94 of method 82 are optional, with corresponding changes being made to other steps as necessary.

After step 104 has been completed, the method 82 returns to the method 66 at step 70 (FIG. 7). After step 70 has been completed, the method 66 ends.

Thus, there is provided a method of installing an audio system on a vehicle having a vehicle body dimensioned for receiving a side-view mirror, the method comprising: (a) determining that the side-view mirror is removed from the vehicle body; and (b) mounting a speaker pod of the audio system, along a mounting member of the speaker pod, to the vehicle body in place of the side-view mirror such that a housing of the speaker pod supports a speaker operable to produce sound.

While embodiments of the invention have been described and illustrated, such embodiments should be considered illustrative of the invention only. The invention may include variants not described or illustrated herein in detail. Thus, the embodiments described and illustrated herein should not be considered to limit the invention as construed in accordance with the accompanying claims.

What is claimed is:

1. A method of installing an audio system on a vehicle having a vehicle body dimensioned for receiving a side-view mirror, the method comprising:
    (a) determining that the side-view mirror is removed from the vehicle body; and
    (b) mounting a speaker pod of the audio system, along a mounting member of the speaker pod, to the vehicle body in place of the side-view mirror such that a housing of the speaker pod supports a speaker operable to produce sound.

2. The method of claim 1 wherein step (b) comprises mounting the speaker pod such that an outer forward portion of the housing is shaped similarly to a corresponding portion of the side-view mirror.

3. The method of claim 1 further comprising:
    (c) mounting an audio amplifier via an amplifier bracket to the vehicle body such that the amplifier is operable to drive the speaker when the speaker is in electrical communication with the amplifier.

4. The method of claim 3 further comprising:
    (d) installing a battery-disconnect switch in electrical communication with the amplifier and a battery of the vehicle.

5. The method of claim 4 further comprising:
    (e) installing a user-input controller in electrical communication with the amplifier such that the controller is operable to receive user input via wireless communications.

6. The method of claim 1 wherein step (b) comprises mounting the speaker pod when the vehicle is a personal watercraft and the speaker is marine grade.

7. The method of claim 1 further comprising:
    (f) mounting a second said speaker pod, along a second mounting member of said second speaker pod, to the vehicle body in place of a second side-view mirror of the vehicle such that a second said housing of said second speaker pod supports a second said speaker.

8. An audio system for a vehicle having a vehicle body dimensioned for receiving a side-view mirror, the audio system comprising:
    (a) first means for producing sound;
    (b) second means for mounting the first means to the vehicle body in place of the side-view mirror; and
    (c) third means for mounting to the vehicle body an audio amplifier for driving the first means.

* * * * *